US008855322B2

(12) United States Patent
Ryu et al.

(10) Patent No.: US 8,855,322 B2

(45) Date of Patent: Oct. 7, 2014

(54) LOUDNESS MAXIMIZATION WITH CONSTRAINED LOUDSPEAKER EXCURSION

(75) Inventors: Sang-Uk Ryu, San Diego, CA (US); Jongwon Shin, San Diego, CA (US); Roy Silverstein, San Diego, CA (US); Andre Gustavo P. Schevciw, San Diego, CA (US); Pei Xiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 118 days.

(21) Appl. No.: 13/206,379

(22) Filed: Aug. 9, 2011

(65) Prior Publication Data

US 2012/0179456 A1 Jul. 12, 2012

Related U.S. Application Data

(60) Provisional application No. 61/432,094, filed on Jan. 12, 2011.

(51) Int. Cl.

| | |
|---|---|
| ***G06F 15/00*** | (2006.01) |
| ***G10L 25/00*** | (2013.01) |
| ***G10L 19/00*** | (2013.01) |
| ***G10L 21/00*** | (2013.01) |
| ***G10L 21/02*** | (2013.01) |
| ***G10L 21/06*** | (2013.01) |
| ***H03G 5/00*** | (2006.01) |
| ***H03G 3/00*** | (2006.01) |
| ***H04R 5/00*** | (2006.01) |
| ***H04R 29/00*** | (2006.01) |
| ***H03G 3/20*** | (2006.01) |
| ***H04B 1/00*** | (2006.01) |
| ***H04R 3/00*** | (2006.01) |

(52) U.S. Cl.

CPC .................................... *H04R 3/007* (2013.01)

USPC ............ 381/55; 381/103; 381/104; 381/105; 381/106; 381/107; 381/17; 381/18; 381/56; 381/57; 381/58; 381/119; 381/120; 381/321; 381/327; 381/72; 704/225; 704/226; 704/200.1; 704/500; 704/270; 704/271; 704/275; 704/270.1; 704/224; 704/246; 704/233; 704/235; 704/203; 704/201; 704/228

(58) Field of Classification Search

CPC ............ H04S 1/002; H04S 5/02; H04S 3/02; H04S 3/00; H03G 3/001; H03G 7/002; H03G 9/02; H04R 25/502; H04R 25/602; H04R 25/70; H04R 25/558; H04R 25/505; H04R 25/453; H04R 9/06; G06F 17/289; G06F 17/274; G06F 17/2735; H04B 1/665; G11C 2207/16; H05K 999/99; G10L 21/0208; G10L 25/90; G10L 19/005; G10L 15/22; G10L 15/20; G10L 15/265; G10L 17/005; G10L 15/30; G10L 21/0316

USPC ...................... 379/400, 406; 381/55, 59, 182, 381/103–107, 17–18, 56–58, 119–120, 321, 381/327, 72, 301, 388, 318, 83, 71.1, 71.6, 381/60, 314, 102, 320, 94.7, 98, 91, 381/94.1–94.2; 704/2, 225–226, 500, 704/200.1, 271, 10, 1, 207, 270, 231, 3, 704/224, 233, 235, 203, 246, 201, 275, 704/270.1, 205, 228, 258

See application file for complete search history.

(56) References Cited

U.S. PATENT DOCUMENTS

| | | | | |
|---|---|---|---|---|
| 4,969,195 | A * | 11/1990 | Noro | 381/96 |
| 5,600,718 | A * | 2/1997 | Dent et al. | 379/406.06 |
| 6,639,989 | B1 * | 10/2003 | Zacharov et al. | 381/303 |
| 7,274,793 | B2 * | 9/2007 | Combest et al. | 381/55 |
| 7,372,966 | B2 * | 5/2008 | Bright | 381/55 |
| 7,894,614 | B2 * | 2/2011 | Cordell | 381/103 |
| 8,144,881 | B2 * | 3/2012 | Crockett et al. | 381/56 |
| 8,194,869 | B2 * | 6/2012 | Mihelich et al. | 381/59 |
| 8,340,307 | B2 * | 12/2012 | Barr et al. | 381/55 |
| 8,351,621 | B2 * | 1/2013 | Lehnert et al. | 381/106 |
| 2004/0001597 | A1 * | 1/2004 | Marton | 381/71.1 |
| 2004/0086140 | A1 * | 5/2004 | Fedigan et al. | 381/96 |

| | | | | |
|---|---|---|---|---|
| 2004/0184623 | A1* | 9/2004 | Johannsen et al. | 381/117 |
| 2005/0031131 | A1* | 2/2005 | Browning et al. | 381/59 |
| 2006/0262951 | A1* | 11/2006 | Jun | 381/312 |
| 2007/0140058 | A1* | 6/2007 | McIntosh et al. | 367/140 |
| 2008/0170723 | A1* | 7/2008 | Sakagami et al. | 381/103 |
| 2008/0175397 | A1* | 7/2008 | Holman | 381/55 |
| 2009/0129601 | A1* | 5/2009 | Ojala et al. | 381/1 |
| 2009/0147963 | A1* | 6/2009 | Smith | 381/62 |
| 2010/0119072 | A1* | 5/2010 | Ojanpera | 381/17 |
| 2010/0202632 | A1* | 8/2010 | Seefeldt et al. | 381/107 |
| 2010/0290643 | A1* | 11/2010 | Mihelich et al. | 381/99 |
| 2011/0085678 | A1* | 4/2011 | Pfaffinger | 381/96 |
| 2011/0123031 | A1* | 5/2011 | Ojala | 381/17 |
| 2011/0228945 | A1* | 9/2011 | Mihelich et al. | 381/59 |
| 2011/0311062 | A1* | 12/2011 | Seefeldt et al. | 381/17 |
| 2012/0008799 | A1* | 1/2012 | Disch et al. | 381/98 |
| 2012/0063614 | A1* | 3/2012 | Crockett et al. | 381/98 |
| 2012/0063615 | A1* | 3/2012 | Crockett et al. | 381/98 |
| 2012/0106743 | A1* | 5/2012 | Seefeldt et al. | 381/17 |
| 2012/0121098 | A1* | 5/2012 | Gautama | 381/59 |
| 2012/0155659 | A1* | 6/2012 | Crockett et al. | 381/57 |
| 2012/0163629 | A1* | 6/2012 | Seefeldt | 381/104 |
| 2012/0237045 | A1* | 9/2012 | Mihelich et al. | 381/59 |
| 2012/0275606 | A1* | 11/2012 | Breebaart et al. | 381/17 |
| 2012/0288118 | A1* | 11/2012 | Gautama | 381/98 |
| 2012/0300949 | A1* | 11/2012 | Rauhala et al. | 381/55 |
| 2012/0321096 | A1* | 12/2012 | Crockett et al. | 381/57 |
| 2013/0108079 | A1* | 5/2013 | Sato | 381/107 |
| 2013/0129124 | A1* | 5/2013 | Westermann et al. | 381/312 |

FOREIGN PATENT DOCUMENTS

EP 2369852 A1 9/2011

OTHER PUBLICATIONS

A. Harma et al., "Volume Control in Netowrked Audio Systems", International Workshop on Acoustic Signal Enhancement (IWAENC 2005) , pp. 245-248.*

International Search Report and Written Opinion—PCT/US2012/020672—ISA/EPO—May 16, 2012.

* cited by examiner

*Primary Examiner* — Paras D Shah
*Assistant Examiner* — Anne Thomas-Homescu
(74) *Attorney, Agent, or Firm* — Austin Rapp & Hardman

(57) ABSTRACT

An original loudness level of an audio signal is maintained for a mobile device while maintaining sound quality as good as possible and protecting the loudspeaker used in the mobile device. The loudness of an audio (e.g., speech) signal may be maximized while controlling the excursion of the diaphragm of the loudspeaker (in a mobile device) to stay within the allowed range. In an implementation, the peak excursion is predicted (e.g., estimated) using the input signal and an excursion transfer function. The signal may then be modified to limit the excursion and to maximize loudness.

40 Claims, 12 Drawing Sheets

LOUDNESS MAXIMIZATION WITH CONSTRAINED LOUDSPEAKER EXCURSION

CROSS-REFERENCE TO RELATED APPLICATIONS

This application claims priority under the benefit of 35 U.S.C. §120 to Provisional Patent Application No. 61/432,094, filed on Jan. 12, 2011. This provisional patent application is hereby expressly incorporated by reference herein in its entirety.

BACKGROUND

Due to mobility requirements and dimension restrictions, a mobile device (e.g., a mobile phone, a smart phone, etc.) typically comprises one or more small-size or low-cost loudspeakers. Sound quality for audio and speech signals used in mobile devices therefore has been severely limited by not being able to produce enough loudness without introducing damage to the loudspeaker(s), as compared to non-mobile or high-end loudspeaker systems. The widespread popularity of smart phones and of multimedia-intensive mobile applications has triggered demand for better audio quality for mobile devices. Several approaches have been used to achieve better audio sound quality with enough loudness. For example, automatic gain control (AGC) and/or automatic volume control (AVC) have been widely implemented to ease the existing audio quality problem to some extent for mobile devices.

The small loudspeaker in a mobile device can work in a linear mode for small signals, but its linearity would be no longer valid for large signals with high compression. A signal low enough in frequency and/or large enough in level may cause excessive movement of the loudspeaker diaphragm.

Excursion refers to the distance that a diaphragm in a loudspeaker may travel from its resting position. Signals low enough in frequency and/or large enough in level may cause excessive movement of the diaphragm of the loudspeaker in a mobile device. When the loudspeaker is driven by such a high power level signal, the diaphragm movement (i.e., the excursion) consistently exceeds its excursion limit, which leads to poor sound and an unpleasant audio experience for the listener. More particularly, in such a case, the voice coil tends to exit the gap, resulting in the coil rubbing and possibly reaching a break-up mode of the voice coil displacement.

Known prior art diaphragm excursion control techniques use a high-pass or a notch filter to suppress the low frequency contents around the resonance frequency that may cause excessive diaphragm movement. Due to the lack of low frequencies and loss of loudness, these approaches often render an unnatural and tinny sound. Moreover, because the low frequencies in the loudspeaker signal are always filtered out, the unpleasant experience for the listener persists even when the signal is small enough to stay in the loudspeaker's linear range.

SUMMARY

An original loudness level of an audio signal (e.g., speech signal or other input audio signal) is maintained for a mobile device while maintaining sound quality as good as possible and protecting the loudspeaker used in the mobile device. More particularly, the loudness of an audio signal may be maximized while controlling the excursion of the diaphragm of the loudspeaker (in a mobile device) to stay within the allowed range.

In an implementation, the peak excursion is predicted (e.g., estimated) using the input signal and an excursion transfer function. The signal is modified to limit the excursion and to maximize loudness.

In an implementation, in a first operation, to estimate the peak excursion, the input audio signal or speech signal (i.e., the input signal) is filtered with the impulse response (of the excursion transfer function) of the loudspeaker to estimate the peak excursion for the signal. In a second operation, an excursion limiting signal processor receives the input audio signal and the estimated peak excursion, and modifies the input audio signal to maximize the perceived loudness such that the estimated peak excursion of the output signal does not exceed the maximum excursion of the loudspeaker (i.e., the output signal remains in the safe range of the loudspeaker).

In an implementation, the perceived loudness can be incorporated into the signal modification. The signal processing will be excursion limiting while maximizing the perceived loudness. An approximation of a psychoacoustic loudness model (such as Moore's loudness model) can be used. The approximation is based upon the subband energy of each equal rectangular band (ERB) of the input signal and the specific loudness at each ERB subband.

In an implementation, the excursion limiting signal processing may be implemented in the subband domain instead of the full-band time domain. The subband domain may be effective because the frequency components in signals have different levels of contributions to excursion and perceived loudness. In such a case, excursion prediction may be performed in the frequency domain.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there are shown in the drawings example constructions of the embodiments; however, the embodiments are not limited to the specific methods and instrumentalities disclosed. In the drawings.

DETAILED DESCRIPTION

Figure 1:
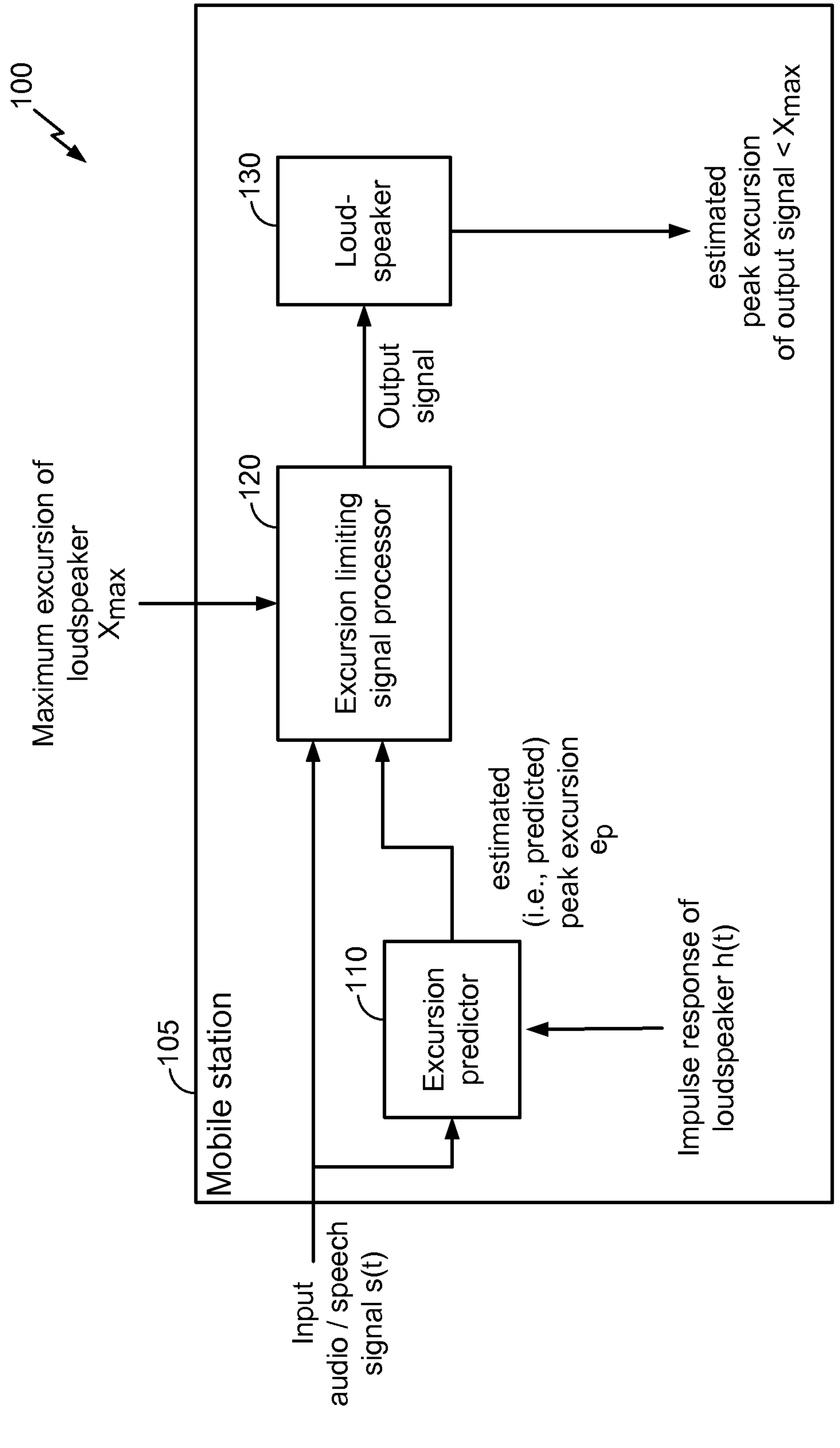
FIG. 1 is a diagram of an implementation of a system for providing loudness maximization with constrained loudspeaker excursion.

FIG. 1 is a diagram of an implementation of a system 100 for providing loudness maximization with constrained loudspeaker excursion. The system 100 may be implemented in a mobile station 105 (also referred to as a mobile device). The mobile station 105 may be a wireless communication device such as a cellular phone, a smart phone, a terminal, a handset, a personal digital assistant (PDA), a wireless modem, a cordless phone, a handheld device, a laptop computer, etc. An example mobile station is described with respect to FIG. 11.

The mobile station 105 may be capable of communicating with packet switched networks and circuit switched networks. It is contemplated that the configurations disclosed herein may be adapted for use in networks that are packet switched (for example, wired and/or wireless networks arranged to carry audio transmissions according to protocols such as VoIP) and/or circuit switched. It is also contemplated that the configurations disclosed herein may be adapted for use in narrowband coding systems (e.g., systems that encode an audio frequency range of about four or five kilohertz) and for use in wideband coding systems (e.g., systems that encode audio frequencies greater than five kilohertz), including whole-band wideband coding systems and split-band wideband coding systems. Example combinations include circuit switched air interface and circuit switched core network, circuit switched air interface and packet switched core network, and IP access and packet switched core network, for example.

The mobile station 105 may comprise an excursion predictor 110, an excursion limiting signal processor 120, and a loudspeaker 130. Using techniques described further herein, the excursion predictor 110 may predict the estimated peak excursion of the loudspeaker 130 over a short time interval (e.g. a 20 ms frame), and the excursion limiting signal processor 120 may generate an output signal to be provided to the loudspeaker 130 using the estimated peak excursion. The excursion predictor 110 and the excursion limiting signal processor 120 may be implemented using one or more processors or computing devices such as the computing device 1200 illustrated in FIG. 12.

The excursion predictor 110 predicts (e.g., estimates) the peak excursion of the loudspeaker 130 for an input audio signal (which may be a speech signal, for example) using the input audio signal and an excursion transfer function of the loudspeaker 130. More particularly, to estimate the peak excursion, the original audio/speech signal (the input signal) s(t) is filtered with the impulse response of excursion transfer function of the loudspeaker h(t) to estimate the peak excursion $e_p$ for the input audio/speech signal. If the impulse response of excursion transfer function of the loudspeaker h(t) is known, the excursion e(t) may be estimated by $e(t)=h(t)*s(t)$, where * denotes a convolution of two sequences.

The estimated peak excursion $e_p$ over a short time interval of the input audio signal is provided to the excursion limiting signal processor 120. Using the estimated peak excursion $e_p$ and the maximum excursion $X_{max}$ of the loudspeaker 130 (e.g., a predetermined characteristic of the loudspeaker 130), the input audio signal is processed (i.e., modified) to determine an output signal $\tilde{s}(t)$ that allows the loudspeaker diaphragm to move within the maximum excursion $X_{max}$ of the loudspeaker 130. In an implementation, the excursion limiting signal processor 120 maximizes the perceived loudness such that the estimated peak excursion $\tilde{e}_p$ of the output signal $\tilde{s}(t)$ does not exceed the maximum excursion $X_{max}$ of the loudspeaker 130. The peak excursion $e_p$ of the loudspeaker can be determined by $e_p=\max\{|e(t)|\}$ over a short time interval of the input audio signal. In this manner, the input audio signal is modified to limit the excursion and to maximize the loudness. The output signal will be in the safe range of the loudspeaker 130.

In an implementation, a metric for a perceived loudness can be incorporated into the signal modification by the excursion limiting signal processor 120. An approximation of Moore's loudness model (or any psychoacoustic loudness model, depending on the implementation) can be used. As described further herein, the approximation is based upon the subband energy of each equal rectangular band (ERB) of the input audio signal and the specific loudness at each ERB subband. Thus, in an implementation, signal processing for the excursion limiting signal processor 120 may be implemented in the subband domain instead of the full-band time domain. This subband or frequency domain approach may be effective in calculating perceived loudness and predicting peak excursion, because the frequency components in signals have different levels of contributions to excursion and perceived loudness.

Figure 2:
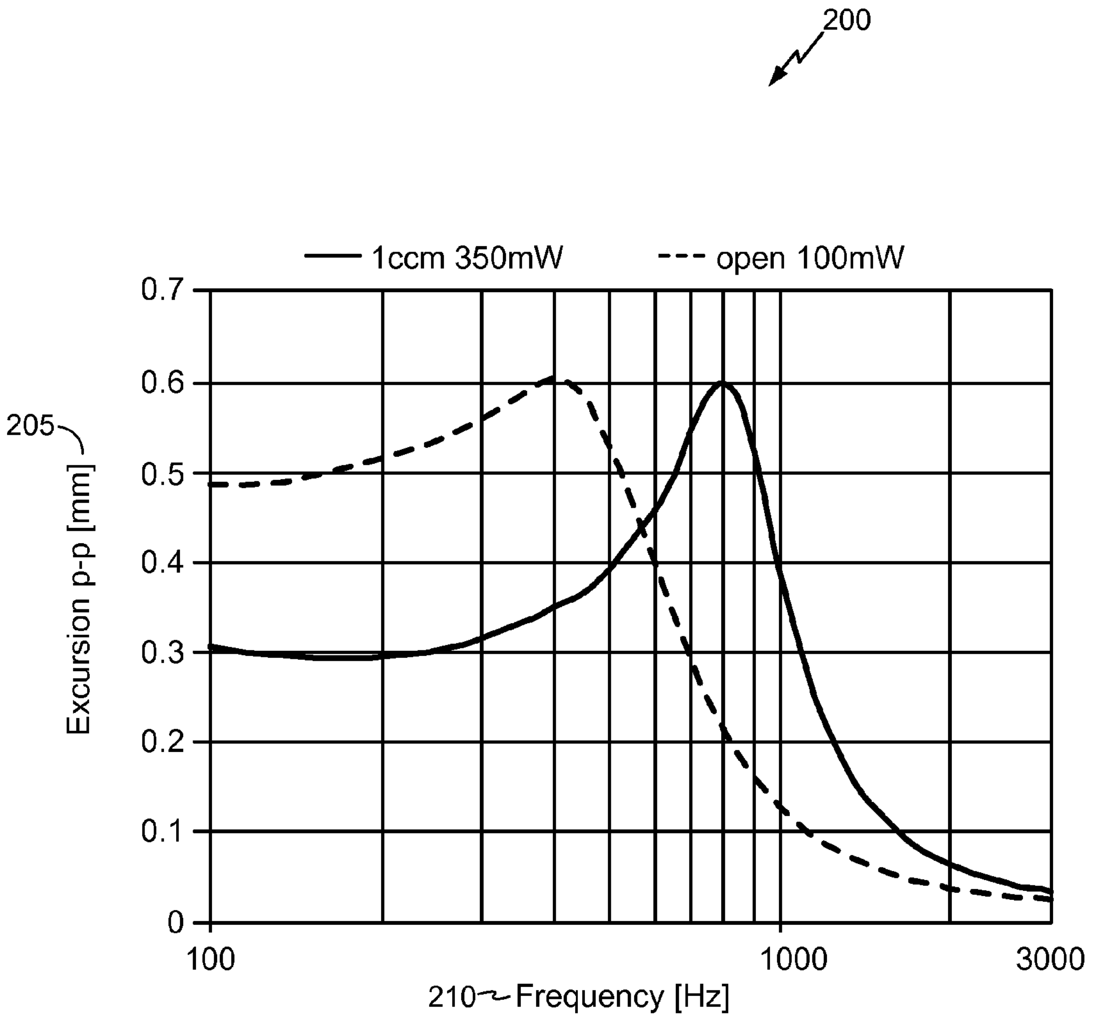
FIG. 2 is a diagram of an impulse response of an example excursion transfer function of a small loudspeaker.

FIG. 2 is a diagram of an impulse response h(t) 200 of an example excursion transfer function of a small loudspeaker, such as the loudspeaker 130. The impulse response 200 of the loudspeaker 130 may be given by the specification of the loudspeaker 130 or may be estimated or measured from the characteristics of mobile device 100. In the example of FIG. 2 for an example loudspeaker, the maximum excursion $X_{max}$ is about 0.3 mm at its resonance frequency 780 Hz. FIG. 2 also shows that the excursion 205 of the loudspeaker is not uniform across the frequency band 210.

As noted above, the excursion limiting signal processor 120 receives the input audio/speech signal and the estimated peak excursion $e_p$, and modifies the input audio/speech signal to maximize the perceived loudness in such a way that the estimated peak excursion $\tilde{e}_p$ of output signal $\tilde{s}(t)$ does not exceed the maximum excursion $X_{max}$ of the loudspeaker 130. In an implementation, the input signal may be segmented into small chunks of data, or frames, before it is processed or modified by the excursion limiting signal processor 120.

In an implementation, because the frequency components in the loudspeaker signal have different levels of contributions to excursion and perceived loudness, subband or frequency domain signal analysis may be used. For example, the input signal may be transformed into psycho-acoustically motivated subband signals. For example, the input signal may be transformed into critical bands or equal rectangular bandwidth (ERB) signals. Then, for each subband signal, its spectral energy may be determined, which may be then used to determine per band loudness and excursion.

In an implementation, to incorporate a perceived loudness criterion in the signal modification, the well known Moore's loudness model may be adopted. Moore's loudness model in each subband can be described as follows:

$$N_b=C\{(G_b \cdot E_{SIG(b)}+A_b)^{\alpha b}-A_b^{\alpha b}\},$$

where $N_b$ is the specific loudness at b-th ERB band, $E_{SIG(b)}$ is the excitation pattern at the b-th ERB band, $G_b$, $A_b$ and $\alpha_b$ are ERB band dependent constants, and C is a predetermined constant. All the parameters used in Moore's loudness model are well known and a further description herein is omitted for brevity.

Figure 3:
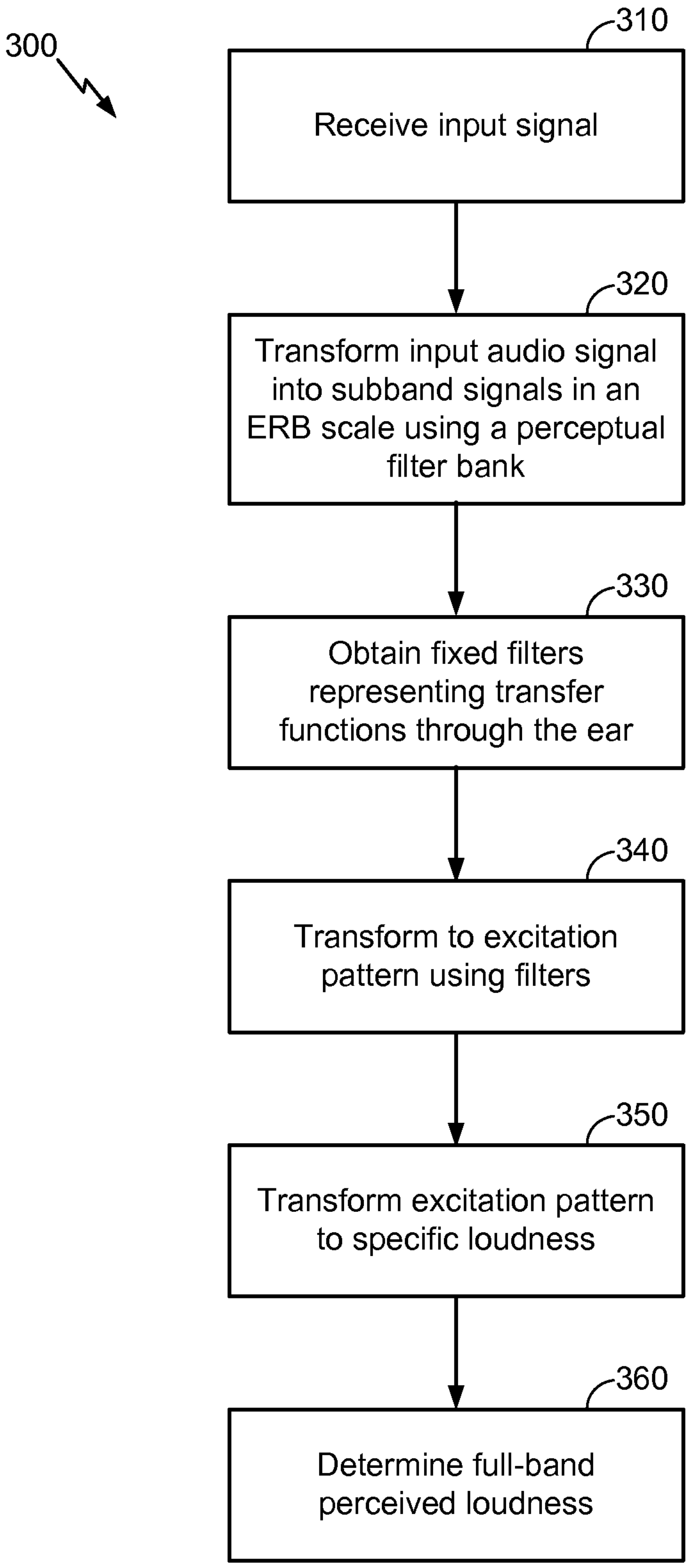
FIG. 3 is an operational flow of an implementation of a method for determining a loudness model.

FIG. 3 is an operational flow of an implementation of a method 300 for determining a loudness model, such as Moore's loudness model. At 310, an input audio signal s(t) (e.g., a speech signal) is received at the mobile station 105. At 320, the input audio signal may be transformed into subband signals in an ERB scale using a perceptual filter bank (e.g., implemented in a processor of the mobile station 105).

For each ERB subband, the following operations may be performed. At 330, fixed filters representing transfer functions through the outer and middle ear may be obtained e.g., retrieved from storage of the mobile station 105. At 340, an excitation pattern may be calculated from the physical spectrum; i.e., a transformation is performed to an excitation pattern. At 350, the excitation pattern is transformed to a specific loudness per each band.

After operations 330-350 have been performed for each subband, a full-band perceived loudness may be determined at 360. Thus, the loudness per subband $N_b$ can be directly used for further processing to limit excursion in subband domain. Each specific loudness (from 350) can be summed across ERB bands to generate full-band perceptual loudness L as follows: $L=\Sigma_b N_b$. The loudness in either subband domain or full-band domain may be measured by using the sone unit of measurement; however, any unit of measurement pertaining to loudness may be used.

Figure 4:
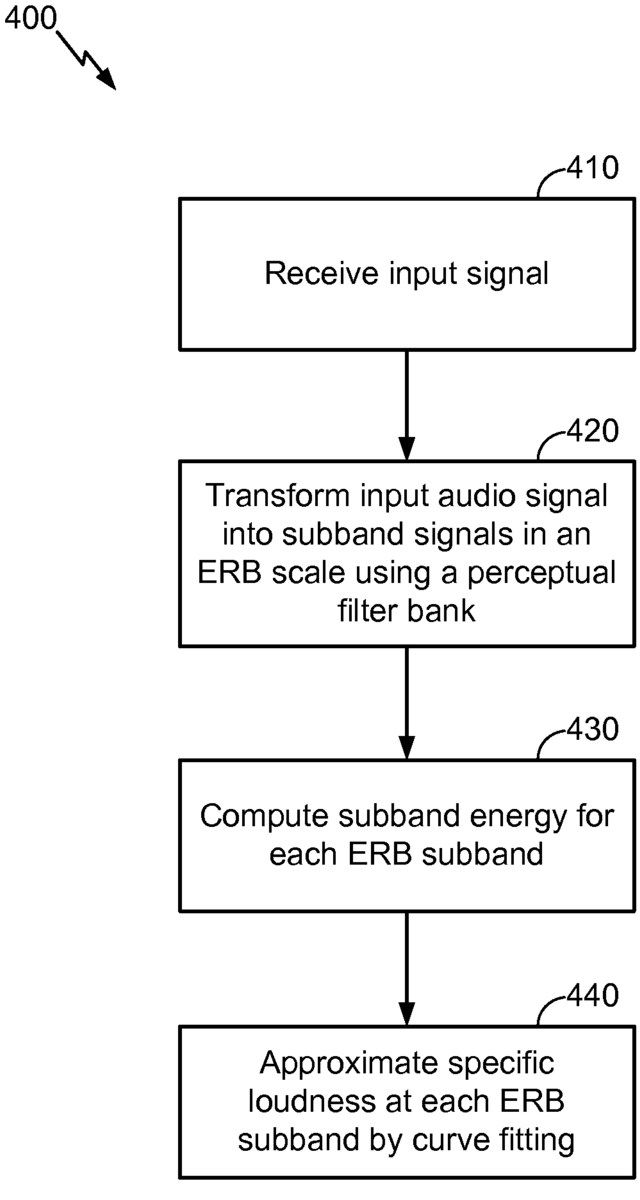
FIG. 4 is an operational flow of an implementation of a method for approximating a loudness model.

The computational complexity of Moore's model can be decreased using an approximation. FIG. 4 is an operational flow of an implementation of a method 400 for approximating a loudness model, such as Moore's loudness model. The specific loudness for each ERB subband may be approximated, for example, based on a curve fitting method.

At 410, an input audio signal s(t) (e.g., a speech signal) is received at the mobile station 105. Similar to 320, at 420, the input audio signal may be transformed into subband signals in an ERB scale using a perceptual filter bank. At 430, for each ERB subband, the subband energy $E_b$ may be calculated. The specific loudness at each ERB subband $N_b$ may be approximated, at 440, based upon $E_b$ and ERB band dependent constants $p_b$ and $q_b$ as shown in equation (1):

$$N_b=C\{(G_b\cdot E_{SIG(b)}+A_b)^{\alpha b}-A_b^{\alpha b}\}\approx q_b\{E_b\}^{pb} \quad (1)$$

Figure 5A:
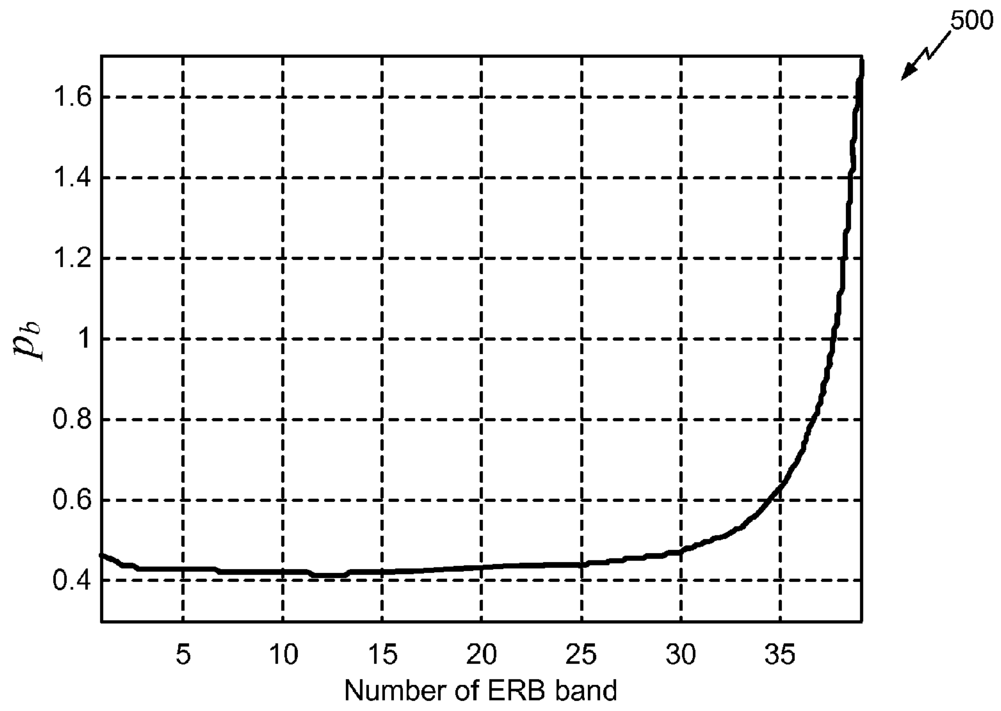
FIGS. 5A and 5B are diagrams showing example values of equal rectangular band (ERB) subband dependent constants.
Figure 5B:
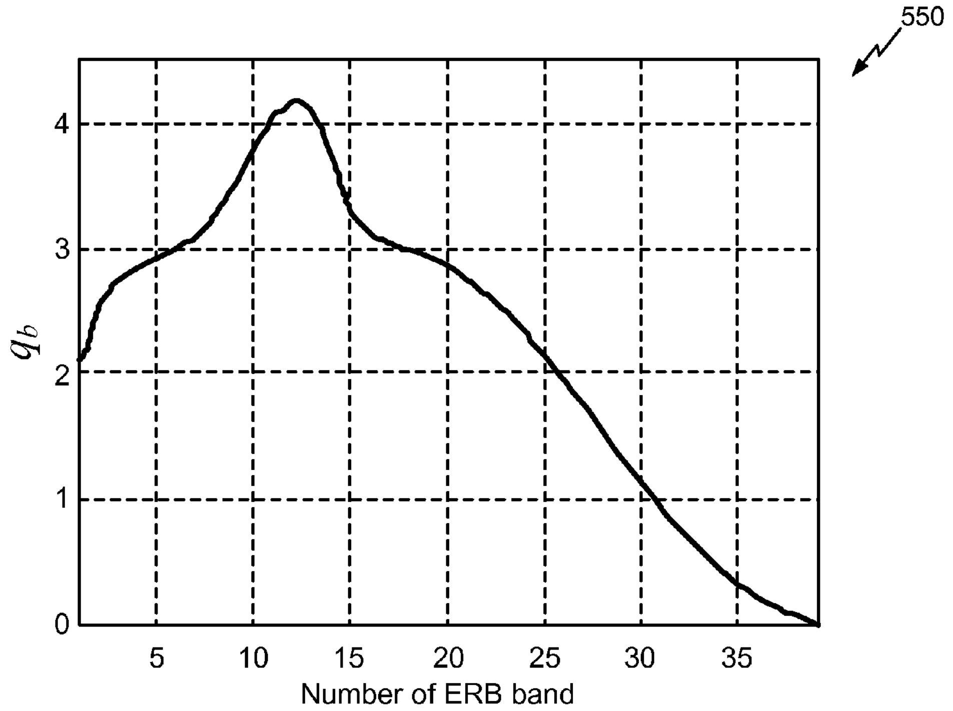

FIGS. 5A and 5B are diagrams showing example values of ERB subband dependent constants. Diagrams 500 and 550 show the exemplary values of $p_b$ and $q_b$, respectively, at various ERB subband values. These constants are predetermined (e.g., pre-calculated or pre-measured) based on the relation between $N_b$ and $E_b$. Each subband may have a unique value for each $p_b$ and $q_b$. The approximation technique is not limited to that described above and it is contemplated that any other known non-curve fitting based approximation methods can be used to approximate Moore's loudness model or any other curve fitting equations may be used instead of the specific technique described above.

Figure 6:
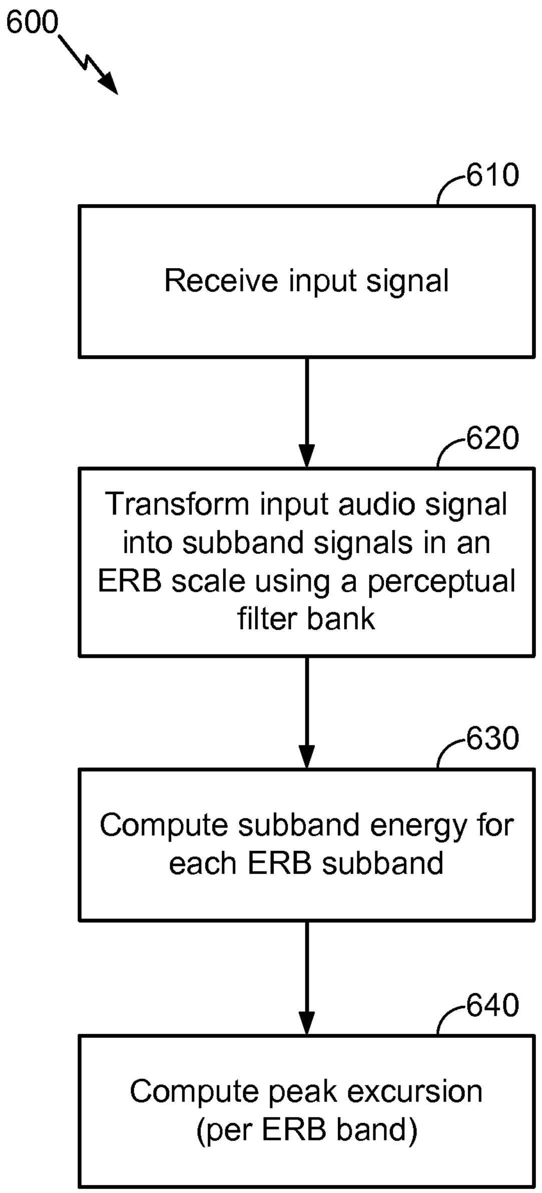
FIG. 6 is an operational flow of an implementation of a method for estimating peak excursion in a subband domain.

FIG. 6 is an operational flow of an implementation of a method 600 for estimating peak excursion in a subband domain. At 610, an input audio signal s(t) (e.g., a speech signal) is received at the mobile station 105. Similar to 420, at 620, the input audio signal may be transformed into subband signals in an ERB scale using a perceptual filter bank. At 630, similar to 430, for each ERB subband, the subband energy $E_b$ may be calculated.

Figure 7:
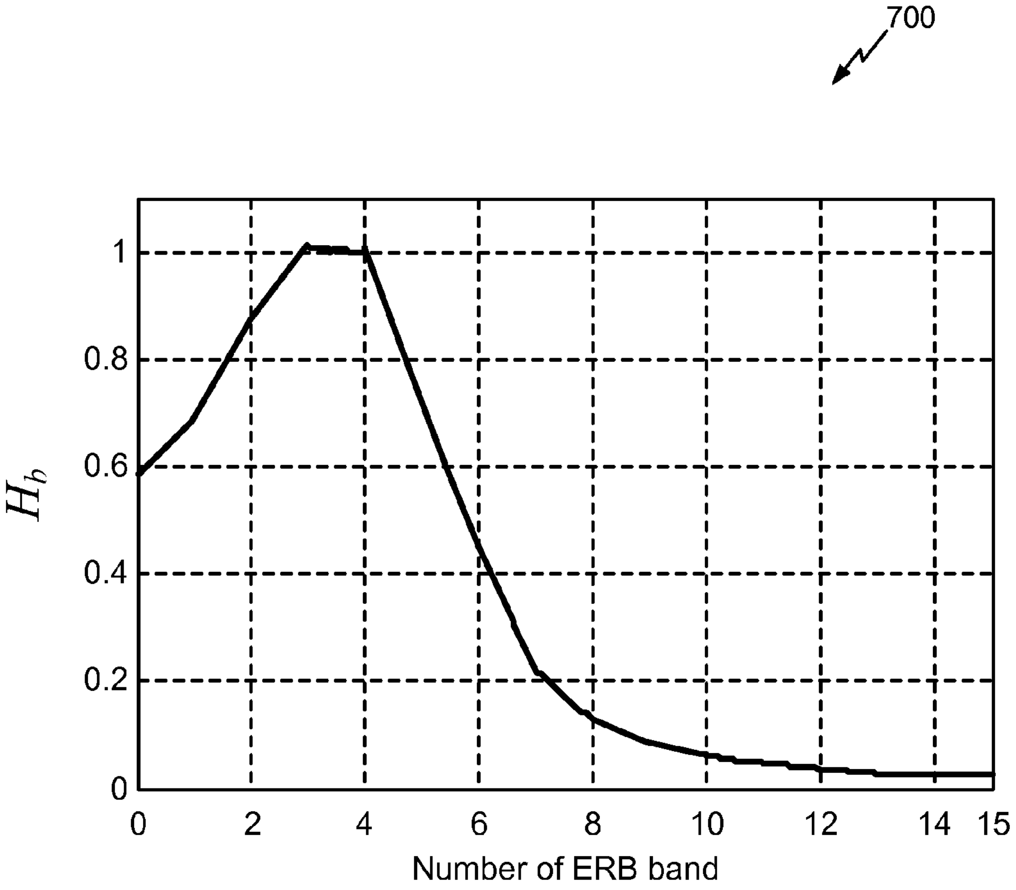
FIG. 7 is a diagram showing example values of the maximum excursion per ERB subband.

At 640, the maximum diaphragm excursion $e_p$, also referred to as peak excursion, for each subband may be estimated, for example, by equation (2).

$$e_p = \max_n\{|e(n)|\} = \max_n\left\{\left|\sum_k S(k)H(k)e^{j2\pi nk/N}\right|\right\} \le \sum_b \sum_{k\in B_b}|S(k)H(k)| \le \sum_b H_b \sum_{k\in B_b}|S(k)| = \sum_b H_b E_b, \quad (2)$$

where $H_b=\max_{k\in B_b}\{|H(k)|\}$, S(k) is the frequency domain representation of the input audio/speech signal, H(k) is the frequency response of the excursion transfer function of the loudspeaker, and $B_b$ is a set of frequency bins that belong to the b-th ERB band. FIG. 7 is a diagram 700 showing example values of $H_b$, the maximum excursion of each ERB band.

Once the approximated terms $N_b$ and $e_p$, are determined, signal processing by the excursion limiting signal processor 120 may be performed in the subband domain instead of the full-band time domain. In the subband domain, the frequency components of the input signal have different levels of contributions to excursion and perceived loudness. Optimization in the subband domain can be reduced to the problem of finding a set of optimal subband gains that maximize perceived loudness with constrained excursion that should be less than the loudspeaker's maximally allowable limit. In other words, the optimization problem in the subband domain may be rephrased as finding a set of ERB gains $\{g_b\}$ for each subband such that $\tilde{S}(k)=g_b S(k)$ for $k \in B_b$ maximizes the perceived loudness $L\approx\Sigma_b p_b\{p_b E_b\}^{q_b}$ with $\tilde{e}_p=\Sigma_b g_b E_b H_b \le X_{max}$.

Figure 8:
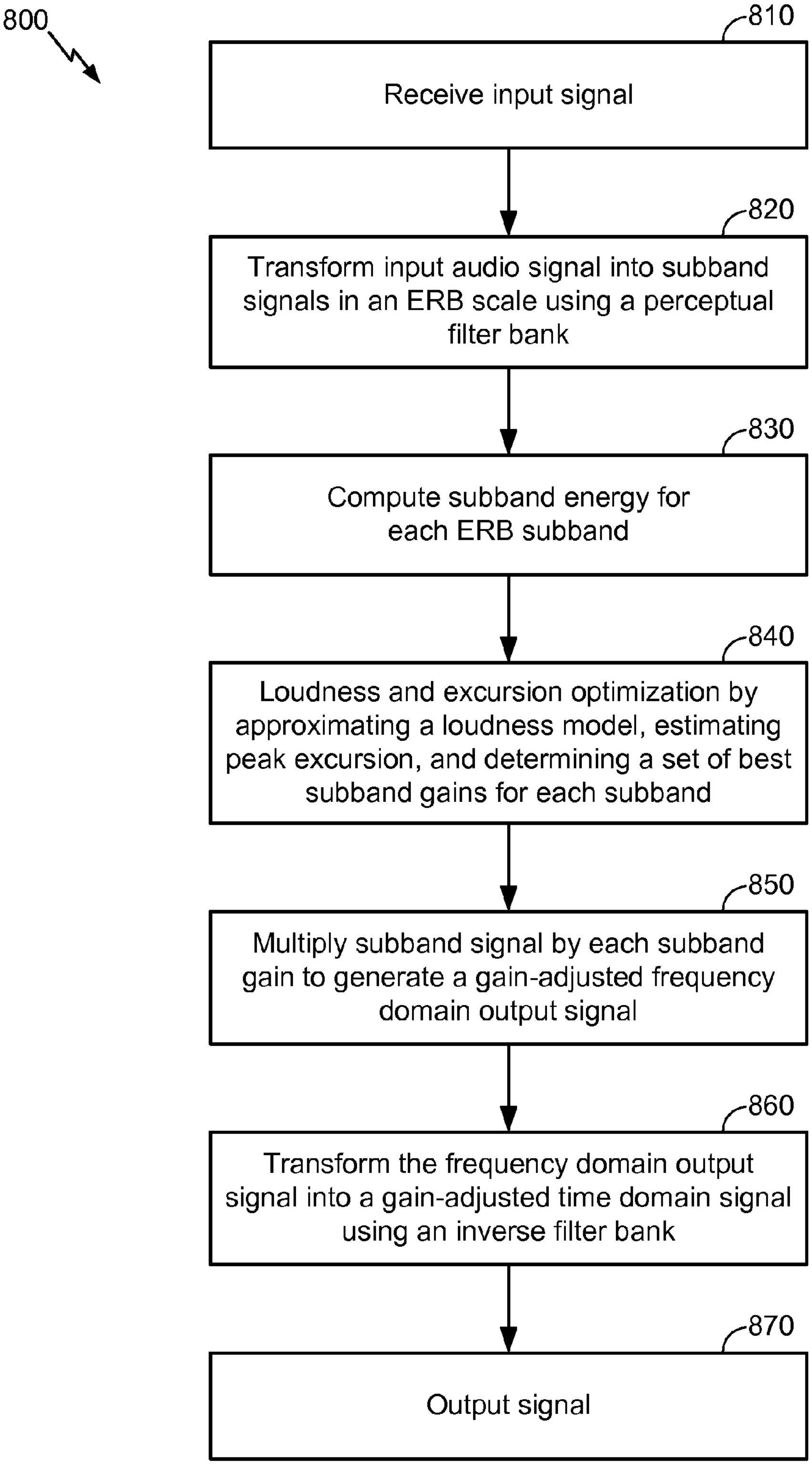
FIG. 8 is an operational flow of an implementation of a method for excursion limiting in the frequency domain.

FIG. 8 is an operational flow of an implementation of a method 800 for excursion limiting in the frequency domain. More particularly, FIG. 8 shows a frequency domain embodiment of the signal processing for the excursion limiting signal processor in which the input signal in each subband is multiplied by ERB gains ($g_b$) in such a way to maximize the full-band perceived loudness with excursion for the current frame being less than loudspeaker's maximum limit $X_{max}$.

At 810, an input audio signal s(t) (e.g., a speech signal) is received at the mobile station 105. At 820, the input audio signal may be transformed into subband signals in an ERB scale using a perceptual filter bank. At 830, for each ERB subband, the subband energy $E_b$ may be calculated.

At 840, the excursion limiting signal processor may perform loudness and excursion optimization by approximating a loudness model, estimating peak excursion, and determining a set of best subband gains for each subband. The subband signal is then multiplied by each subband gain at 850 to generate a gain-adjusted frequency domain output signal. At 860, an inverse filter bank may transform the frequency domain output signal into a gain-adjusted time domain signal. The signal may then be outputted at 870.

Both the loudness model approximation and the peak excursion prediction may be processed for either entire subbands or certain portion of subbands, depending on the implementation. For example, an implementation, the loudness model approximation and the excursion prediction may be processed only for lower frequency regions, or lower subbands, where the typical excursion is much bigger than that of higher frequency regions, or higher subbands. This may save computational complexity of the overall processing which may be beneficial to save battery consumption of mobile station 105.

For loudness and excursion optimization, the excursion limiting signal processor may be configured to find an optimal subband energy that satisfies equation (3):

$$E_b^* = \arg\max_{E_b} \sum_b q_b\{E_b\}^{p_b} \text{ with constraint } \sum_b H_b E_b \le X_{max}. \quad (3)$$

Equation (3) may be rewritten as shown in Equation (4) using Lagrange multipliers, which is a well known method to find the maximum or minimum given constraints:

$$J(E_1, \ldots, E_B, \lambda) = \sum_b q_b\{E_b\}^{p_b} + \lambda\left(\sum_b H_b E_b - X_{max}\right). \quad (4)$$

In one embodiment, a loudness and excursion optimization technique may find Lagrange multipliers using an iterative optimization method. This method may comprise an initialization step and an m-th iteration step (m≥1). The initialization step may comprise the equations:

$$E_b^{(0)} = \sum_{k \in B_b} |S(k)|,$$

$$\lambda^{(0)} = \sum_b p_b q_b \{E_b^{(0)}\}^{p_b}$$

The m-th iteration step (m≥1) may comprise the iterative execution of following equations:

$$E_b^{(m)} = \left(\frac{p_b q_b}{\lambda^{(m-1)} H_b}\right)^{\frac{1}{1-p_b}},$$

$$\lambda^{(m)} = \sum_b p_b q_b \{E_b^{(m)}\}^{p_b}$$

The iteration may continue for a fixed number of times or until these parameters converge close to specific values.

In an implementation, pre-processing may be performed by the excursion limiting signal processor. When the gain change $\{g_b\}$ becomes too much on particular frequency bands, it may generate too much spectral timbre change, causing an unnatural or a disturbing sound. Too much gain change on weak signal frames, such as unvoiced frames, for example, may also generate too much sound pressure level (SPL) fluctuation which may negatively impact the overall sound quality.

Figure 9:
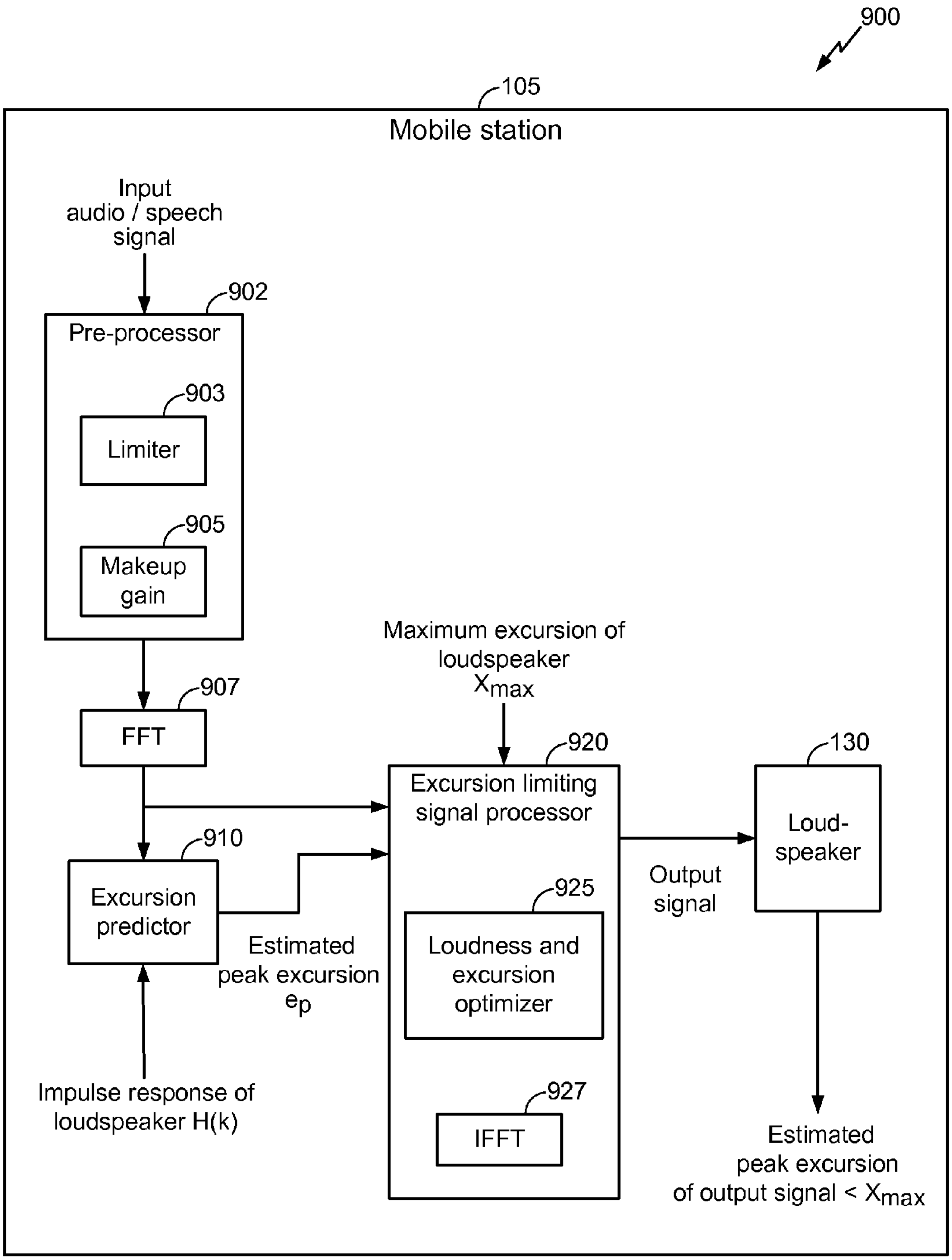
FIG. 9 is a diagram of another implementation of a system for providing loudness maximization with constrained loudspeaker excursion.
Figure 10:
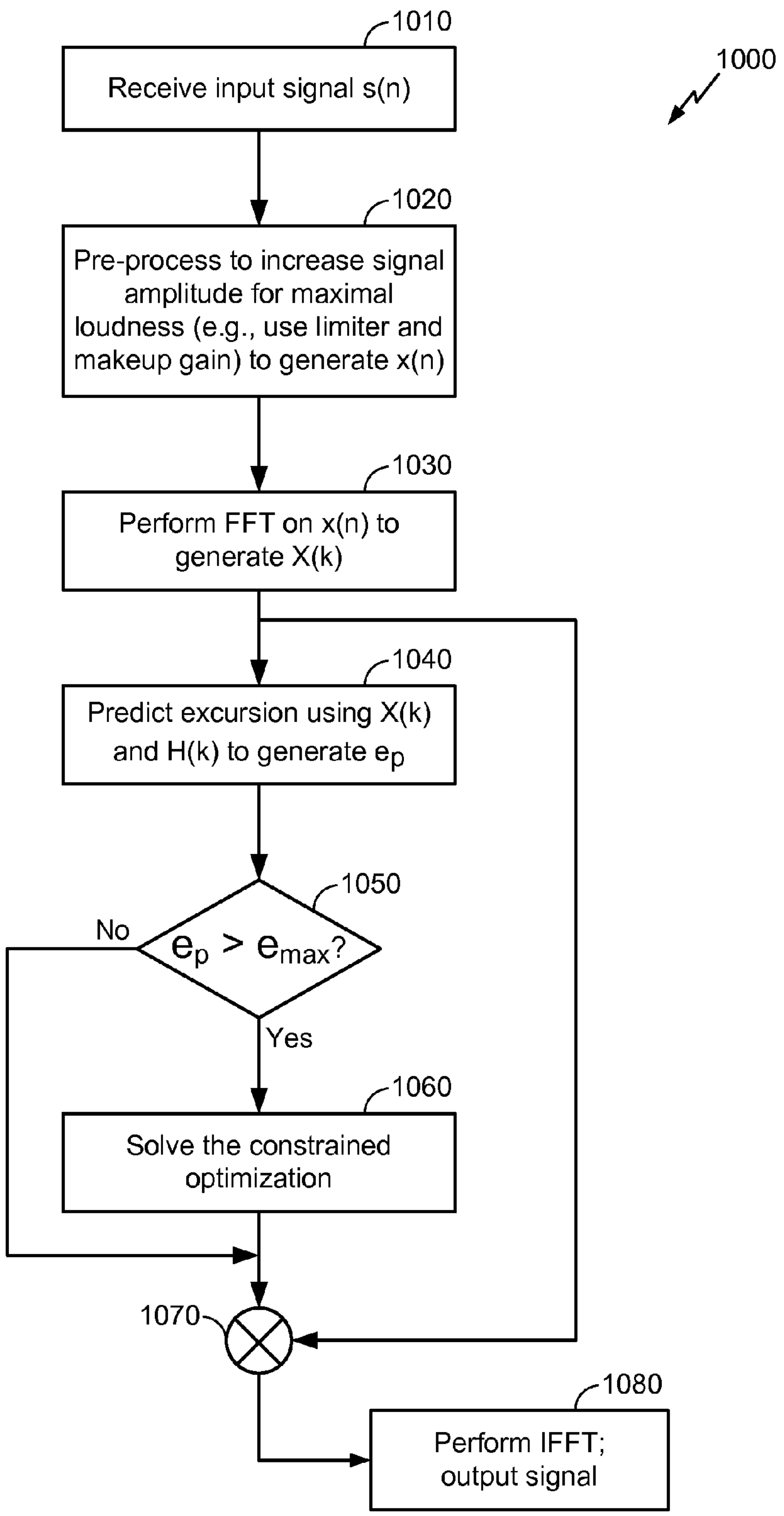
FIG. 10 is an operational flow of an implementation of a method for excursion control.

FIG. 9 is a diagram of another implementation of a system 900 for providing loudness maximization with constrained loudspeaker excursion, and FIG. 10 is an operational flow of an implementation of a method 1000 for excursion control using pre-processing. The pre-processing may be performed before the excursion limiting. Depending on the implementation, a pre-processor 902 may comprise a limiter 903 and/or a makeup gain 905.

At 1010, an input audio signal s(n) (e.g., a speech signal) is received at the pre-processor 902 of the mobile station 105. At 1020, pre-processing is performed. The limiter 903 may be configured to limit the portions of input audio/speech signal having a crest factor greater than limiting threshold. This limiting operation may be useful to create enough digital headroom before the makeup gain 905 boosts the input audio/speech signal. It is preferable to maintain makeup gain (e.g., 15 dB) to be lower than the limiting threshold (e.g., 18 dB), though any values may be used depending on the implementation. By using both a limiter 903 and a makeup gain 905, the input audio/speech signal s(n) may be amplified by makeup gain without generating any saturation distortion.

The pre-processed signal is then prepared for subsequent processing for excursion control by an excursion limiting signal processor 920 (similar to the excursion limiting signal processor 120 and comprising a loudness and excursion optimizer 925 and inverse fast Fourier transform (IFFT) 927). Prior to sending the signal to the excursion limiting signal processor 920, at 1030, the pre-processed signal is transformed with a fast Fourier transform (FFT) 907, and the output of the FFT is provided to an excursion predictor 910 at 1040 to predict an excursion.

It is determined at 1050 if the output of the excursion predictor 910 is less than the maximum excursion of the loudspeaker 130. If so, the constrained optimization is solved at 1060 to find out a best set of subband gains (using the loudness and excursion optimizer 925 of the excursion limiting signal processor 920), which are then provided to a multiplier of the excursion limiting signal processor 920 at 1070; otherwise, unity subband gains are provided to the multiplier at 1070.

At 1070, the multiplier receives the unity subband gains or the solved constrained optimization results and multiplies them with the transformed pre-processed signal (the output of 1030). The result is inverse transformed (e.g., using the IFFT 927) to obtain the resulting output signal at 1080. The output signal may then be provided to the loudspeaker 130.

Increasing the input audio/speech signal level at the pre-processor 902 and putting an additional constraint on ERB gain $\{g_b\}$ at the excursion limiting signal processor 920 may mitigate a spectral timbre change and the SPL (sound pressure level) fluctuation. It is preferable to maintain the ERB gain to be no more than unity, $g_b \le 1$. The pre-processed signal may be analyzed to predict its excursion and subsequently may be modified by multiplying optimal subband gains only when too much excursion is predicted. For example, when $e_p \le X_{max}$, the ERB gain $\{g_b\}$ becomes unity gain and when $e_p > X_{max}$, the ERB gain $\{g_b\}$ typically becomes smaller than unity.

With the addition of the new constraint on ERB gain, the optimization problem presented earlier based on Lagrange multiplier may be written as follows:

$$J(g_1, \ldots, g_B, \lambda, \mu_1, \ldots, \mu_B) = \sum_b p_b\{g_b E_b\}^{q_b} + \lambda\left(\sum_b g_b H_b E_b - X_{max}\right) + \sum_b \mu_b (g_b - 1),$$

where $\mu_b$ denotes a Lagrangian multiplier corresponding to the constraint $g_b \le 1$.

As used herein, the term "determining" (and grammatical variants thereof) is used in an extremely broad sense. The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The term "signal processing" (and grammatical variants thereof) may refer to the processing and interpretation of signals. Signals of interest may include sound, images, and many others. Processing of such signals may include storage and reconstruction, separation of information from noise, compression, and feature extraction. The term “digital signal processing” may refer to the study of signals in a digital representation and the processing methods of these signals. Digital signal processing is an element of many communications technologies such as mobile stations, non-mobile stations, and the Internet. The algorithms that are utilized for digital signal processing may be performed using specialized computers, which may make use of specialized microprocessors called digital signal processors (sometimes abbreviated as DSPs).

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa).

Figure 11:
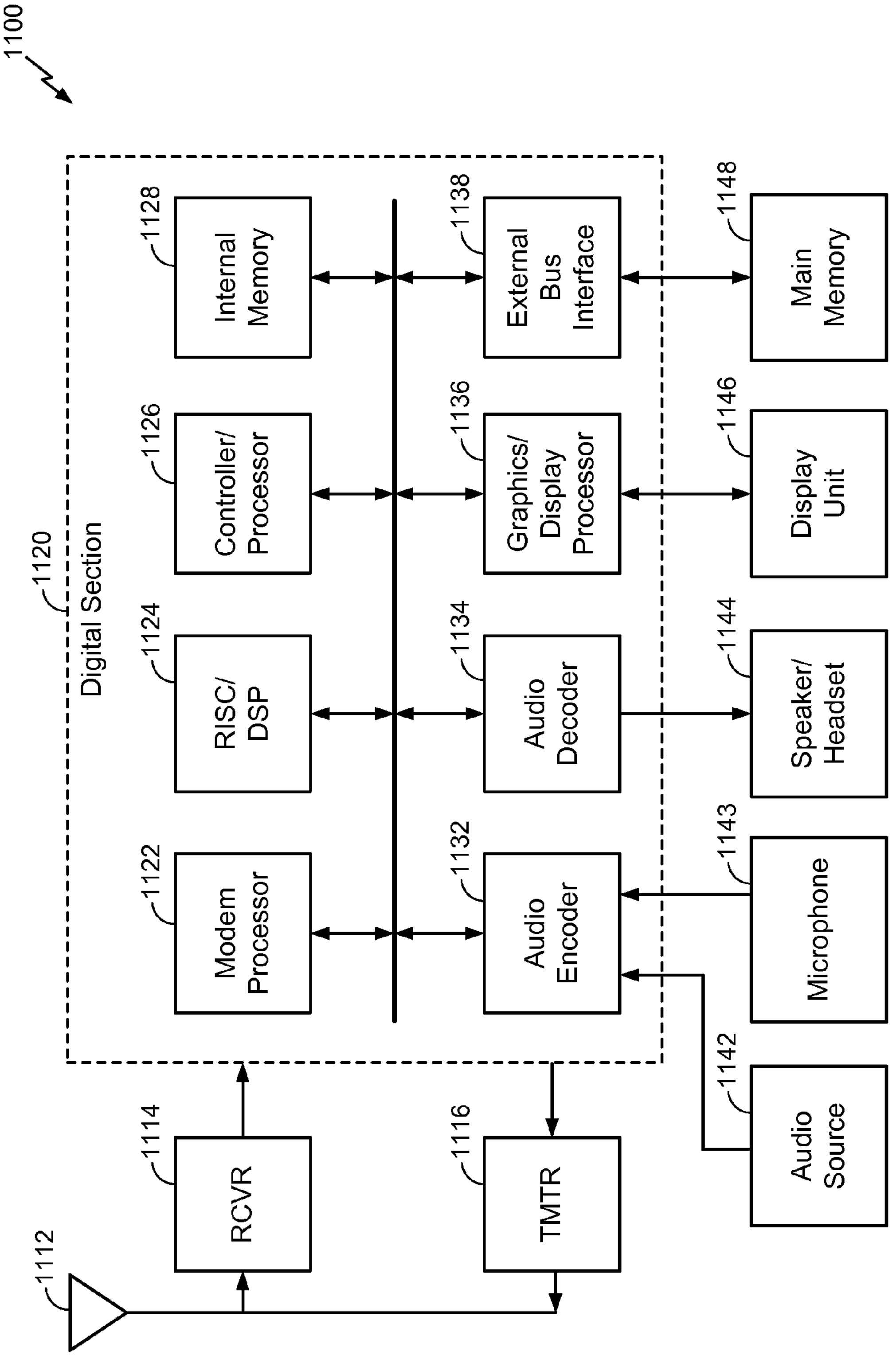
FIG. 11 is a diagram of an example mobile station.

FIG. 11 shows a block diagram of a design of an example mobile station 1100 in a wireless communication system. Mobile station 1100 may be a cellular phone, a terminal, a handset, a PDA, a wireless modem, a cordless phone, etc. The wireless communication system may be a CDMA system, a GSM system, etc.

Mobile station 1100 is capable of providing bidirectional communication via a receive path and a transmit path. On the receive path, signals transmitted by base stations are received by an antenna 1112 and provided to a receiver (RCVR) 1114. Receiver 1114 conditions and digitizes the received signal and provides samples to a digital section 1120 for further processing. On the transmit path, a transmitter (TMTR) 1116 receives data to be transmitted from digital section 1120, processes and conditions the data, and generates a modulated signal, which is transmitted via antenna 1112 to the base stations. Receiver 1114 and transmitter 1116 may be part of a transceiver that may support CDMA, GSM, etc.

Digital section 1120 includes various processing, interface, and memory units such as, for example, a modem processor 1122, a reduced instruction set computer/digital signal processor (RISC/DSP) 1124, a controller/processor 1126, an internal memory 1128, a generalized audio encoder 1132, a generalized audio decoder 1134, a graphics/display processor 1136, and an external bus interface (EBI) 1138. Modem processor 1122 may perform processing for data transmission and reception, e.g., encoding, modulation, demodulation, and decoding. RISC/DSP 1124 may perform general and specialized processing for mobile station 1100. Controller/processor 1126 may direct the operation of various processing and interface units within digital section 1120. Internal memory 1128 may store data and/or instructions for various units within digital section 1120.

Generalized audio encoder 1132 may perform encoding for input signals from an audio source 1142, a microphone 1143, etc. Generalized audio decoder 1134 may perform decoding for coded audio data and may provide output signals to a speaker/headset 1144. Graphics/display processor 1136 may perform processing for graphics, videos, images, and texts, which may be presented to a display unit 1146. EBI 1138 may facilitate transfer of data between digital section 1120 and a main memory 1148.

Digital section 1120 may be implemented with one or more processors, DSPs, microprocessors, RISCs, etc. Digital section 1120 may also be fabricated on one or more application specific integrated circuits (ASICs) and/or some other type of integrated circuits (ICs).

Figure 12:
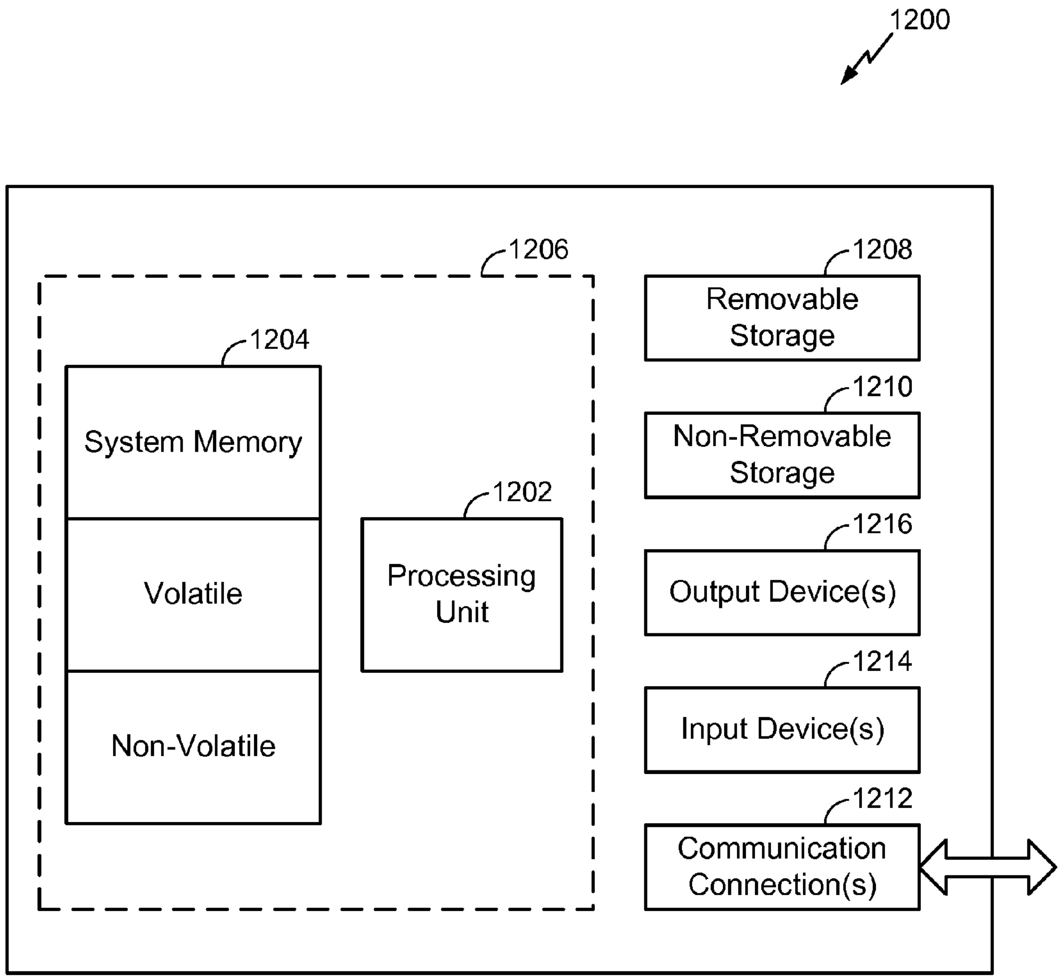
FIG. 12 shows an exemplary computing environment.

FIG. 12 shows an exemplary computing environment in which example implementations and aspects may be implemented. The computing system environment is only one example of a suitable computing environment and is not intended to suggest any limitation as to the scope of use or functionality.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 12, an exemplary system for implementing aspects described herein includes a computing device, such as computing device 1200. In its most basic configuration, computing device 1200 typically includes at least one processing unit 1202 and memory 1204. Depending on the exact configuration and type of computing device, memory 1204 may be volatile (such as random access memory (RAM)), non-volatile (such as read-only memory (ROM), flash memory, etc.), or some combination of the two. This most basic configuration is illustrated in FIG. 12 by dashed line 1206.

Computing device 1200 may have additional features and/or functionality. For example, computing device 1200 may include additional storage (removable and/or non-removable) including, but not limited to, magnetic or optical disks or tape. Such additional storage is illustrated in FIG. 12 by removable storage 1208 and non-removable storage 1210.

Computing device 1200 typically includes a variety of computer-readable media. Computer-readable media can be any available media that can be accessed by device 1200 and include both volatile and non-volatile media, and removable and non-removable media. Computer storage media include volatile and non-volatile, and removable and non-removable media implemented in any method or technology for storage of information such as computer readable instructions, data structures, program modules or other data. Memory 1204, removable storage 1208, and non-removable storage 1210 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1200. Any such computer storage media may be part of computing device 1200.

Computing device 1200 may contain communications connection(s) 1212 that allow the device to communicate with other devices. Computing device 1200 may also have input device(s) 1214 such as a keyboard, mouse, pen, voice input device, touch input device, etc. Output device(s) 1216 such as a display, speakers, printer, etc. may also be included. All these devices are well known in the art and need not be discussed at length here.

In general, any device described herein may represent various types of devices, such as a wireless or wired phone, a cellular phone, a laptop computer, a wireless multimedia device, a wireless communication PC card, a PDA, an external or internal modem, a device that communicates through a wireless or wired channel, etc. A device may have various names, such as access terminal (AT), access unit, subscriber unit, mobile station, mobile device, mobile unit, mobile phone, mobile, remote station, remote terminal, remote unit, user device, user equipment, handheld device, non-mobile station, non-mobile device, endpoint, etc. Any device described herein may have a memory for storing instructions and data, as well as hardware, software, firmware, or combinations thereof.

The excursion predicting and excursion limiting techniques described herein may be implemented by various means. For example, these techniques may be implemented in hardware, firmware, software, or a combination thereof. Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

For a hardware implementation, the processing units used to perform the techniques may be implemented within one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

Thus, the various illustrative logical blocks, modules, and circuits described in connection with the disclosure herein may be implemented or performed with a general-purpose processor, a DSP, an ASIC, a FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

For a firmware and/or software implementation, the techniques may be embodied as instructions on a computer-readable medium, such as random access RAM, ROM, non-volatile RAM, programmable ROM, EEPROM, flash memory, compact disc (CD), magnetic or optical data storage device, or the like. The instructions may be executable by one or more processors and may cause the processor(s) to perform certain aspects of the functionality described herein.

If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, digital versatile disc (DVD), floppy disk and blu-ray disc where disks usually reproduce data magnetically, while discs reproduce data optically with lasers. Combinations of the above should also be included within the scope of computer-readable media.

A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include PCs, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method of constraining loudspeaker excursion in a mobile station, comprising:

receiving an input audio signal at the mobile station;

transforming, in the digital domain, the input audio signal into a plurality of subband signals in the equal rectangular band (ERB) scale;

determining a peak excursion, in the digital domain, of a loudspeaker of the mobile station, for either one or more of the entire ERB subbands or certain portions of one or more ERB subbands;

performing signal processing on the subband signals based on the peak excursion and a maximum loudspeaker excursion to limit the excursion of the loudspeaker; and combining and outputting the signal processed subband signals to the loudspeaker.

2. The method of claim 1, wherein determining the peak excursion of the loudspeaker comprises filtering the subband signals with an excursion transfer function of the loudspeaker.

3. The method of claim 1, wherein performing the signal processing maximizes a perceived loudness of the input audio signal.

4. The method of claim 3, wherein the perceived loudness of the input audio signal is based on an approximation of a psychoacoustic loudness model.

5. The method of claim 3, wherein the perceived loudness of the input audio signal is based on a subband energy of each ERB subband and a specific loudness at each ERB subband.

6. The method of claim 5, further comprising:

determining the subband energy of each ERB subband.

7. The method of claim 6, further comprising approximating the specific loudness at each ERB subband based on a psychoacoustic loudness model.

8. The method of claim 1, wherein performing the signal processing is performed in a frequency domain.

9. The method of claim 1, further comprising pre-processing the input audio signal using a limiter and a makeup gain prior to predicting the excursion of the loudspeaker.

10. The method of claim 1, wherein the mobile station comprises a mobile device, and the input audio signal comprises a speech signal.

11. An apparatus for constraining loudspeaker excursion in a mobile station, comprising:

means for receiving an input audio signal at the mobile station;

means for transforming, in the digital domain, the input audio signal into a plurality of subband signals in the equal rectangular band (ERB) scale;

means for determining a peak excursion, in the digital domain, of a loudspeaker of the mobile station, for either one or more of the entire ERB subbands or certain portions of one or more ERB subbands;

means for performing signal processing on the subband signals based on the peak excursion and a maximum loudspeaker excursion to limit the excursion of the loudspeaker; and means for combining and outputting the signal processed subband signals to the loudspeaker.

12. The apparatus of claim 11, wherein the means for determining the peak excursion of the loudspeaker comprises means for filtering the subband signals with an excursion transfer function of the loudspeaker.

13. The apparatus of claim 11, wherein the means for performing the signal processing maximizes a perceived loudness of the input audio signal.

14. The apparatus of claim 13, wherein the perceived loudness of the input audio signal is based on an approximation of a psychoacoustic loudness model.

15. The apparatus of claim 13, wherein the perceived loudness of the input audio signal is based on a subband energy of each ERB subband and a specific loudness at each ERB subband.

16. The apparatus of claim 15, further comprising:

means for determining the subband energy of each ERB subband.

17. The apparatus of claim 16, further comprising means for approximating the specific loudness at each ERB subband based on a psychoacoustic loudness model.

18. The apparatus of claim 11, wherein performing the signal processing is performed in a frequency domain.

19. The apparatus of claim 11, further comprising means for pre-processing the input audio signal using a limiter and a makeup gain prior to predicting the excursion of the loudspeaker.

20. The apparatus of claim 11, wherein the mobile station comprises a mobile device, and the input audio signal comprises a speech signal.

21. A non-transitory computer-readable medium comprising instructions that cause a computer to:

receive an input audio signal at a mobile station;

transform, in the digital domain, the input audio signal into a plurality of subband signals in the equal rectangular band (ERB) scale;

determine a peak excursion, in the digital domain, of a loudspeaker of the mobile station, for either one or more of the entire ERB subbands or certain portions of one or more ERB subbands;

perform signal processing on the subband signals based on the peak excursion and a maximum loudspeaker excursion to limit the excursion of the loudspeaker; and combine and output the signal processed subband signals to the loudspeaker.

22. The computer-readable medium of claim 21, wherein the instructions that cause the computer to determine the peak excursion of the loudspeaker comprise instructions that cause the computer to filter the subband signals with an excursion transfer function of the loudspeaker.

23. The computer-readable medium of claim 21, wherein the instructions that cause the computer to perform the signal processing maximize a perceived loudness of the input audio signal.

24. The computer-readable medium of claim 23, wherein the perceived loudness of the input audio signal is based on an approximation of a psychoacoustic loudness model.

25. The computer-readable medium of claim 23, wherein the perceived loudness of the input audio signal is based on a subband energy of each ERB subband and a specific loudness at each ERB subband.

26. The computer-readable medium of claim 25, further comprising computer-executable instructions that cause the computer to:

determine the subband energy of each ERB subband.

27. The computer-readable medium of claim 26, further comprising computer executable instructions that cause the computer to approximate the specific loudness at each ERB subband based on a psychoacoustic loudness model.

28. The computer-readable medium of claim 21, wherein performing the signal processing is performed in a frequency domain.

29. The computer-readable medium of claim 21, further comprising computer executable instructions that cause the computer to pre-process the input audio signal using a limiter and a makeup gain prior to predicting the excursion of the loudspeaker.

30. The computer-readable medium of claim 21, wherein the mobile station comprises a mobile device, and the input audio signal comprises a speech signal.

31. An apparatus for constraining loudspeaker excursion in a mobile station, comprising:

an excursion predictor for receiving an input audio signal at the mobile station, and for determining a peak excursion, in the digital domain, of a loudspeaker of the mobile station, for either one or more entire ERB subbands or certain portions of one or more ERB subbands; and an excursion limiting signal processor for transforming, in the digital domain, the input audio signal into a plurality of subband signals in the equal rectangular band (ERB) scale, for performing signal processing on the subband signals based on the peak excursion and a maximum loudspeaker excursion to limit the excursion of the loudspeaker, and for combining and outputting the signal processed subband signals to the loudspeaker.

32. The apparatus of claim 31, wherein the excursion predictor comprises a filter for filtering the subband signals with an excursion transfer function of the loudspeaker.

33. The apparatus of claim 31, wherein the excursion limiting signal processor maximizes a perceived loudness of the input audio signal.

34. The apparatus of claim 33, wherein the perceived loudness of the input audio signal is based on an approximation of a psychoacoustic loudness model.

35. The apparatus of claim 33, wherein the perceived loudness of the input audio signal is based on a subband energy of each ERB subband and a specific loudness at each ERB subband.

36. The apparatus of claim 35, wherein the excursion limiting signal processor further determines the subband energy of each ERB subband.

37. The apparatus of claim 36, wherein the excursion limiting signal processor approximates the specific loudness at each ERB subband based on a psychoacoustic loudness model.

38. The apparatus of claim 31, wherein performing the signal processing is performed in a frequency domain.

39. The apparatus of claim 31, further comprising a preprocessor for pre-processing the input audio signal using a limiter and a makeup gain prior to predicting the excursion of the loudspeaker.

40. The apparatus of claim 31, wherein the mobile station comprises a mobile device, and the input audio signal comprises a speech signal.

* * * * *